US006265996B1

(12) United States Patent
Duffy

(10) Patent No.: US 6,265,996 B1
(45) Date of Patent: Jul. 24, 2001

(54) LOW LATENCY, LOW POWER DESERIALIZER

(75) Inventor: Michael L. Duffy, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/301,900

(22) Filed: Apr. 29, 1999

(51) Int. Cl.$^7$ .............................. H03M 9/00; H03D 3/24
(52) U.S. Cl. ............................ 341/101; 375/376
(58) Field of Search ............................ 341/100, 101; 375/376; 370/463, 376; 360/48

(56) References Cited

U.S. PATENT DOCUMENTS

| 5,757,297 | * | 5/1998 | Ferraiolo et al. | 341/100 |
|---|---|---|---|---|
| 5,953,386 | * | 9/1999 | Anderson | 375/376 |
| 6,026,134 | * | 2/2000 | Duffy et al. | 375/376 |

OTHER PUBLICATIONS

Cypress HOTLink™ Transmitter/Receiver, CY7B923/CY7B933, Apr. 5, 1999, pp. 1–35.

Edward L. Grivna, U.S.S.N. 08/976,072, Circuits and Methods for Framing One or More Data Streams filed Nov. 21, 1997.

Edward L. Grivna, U.S.S.N. 08/975,644, Circuits and Methods for Framing One or More Data Streams filed Nov. 21, 1997.

* cited by examiner

*Primary Examiner*—Patrick Wamsley
(74) *Attorney, Agent, or Firm*—Christopher P. Maiorana, P.C.

(57) ABSTRACT

An apparatus comprising a first circuit and a deserializer circuit. The first circuit may be configured to present a clock signal and a data signal having a second data rate in response to an input signal having a first data rate. The deserializer circuit may be configured to generate an output signal in response to (i) the clock signal, (ii) the data signal and (iii) one or more select signals.

20 Claims, 19 Drawing Sheets

2 low, 5 high, 1 low, 1 high, 1 low 2 high, 5 low, 1 high, 1 low, 1 high

LOW LATENCY, LOW POWER DESERIALIZER

CROSS-REFERENCE TO RELATED APPLICATIONS

This application may relate to co-pending U.S. application Ser. No. 08/976,072, filed Nov. 21, 1997, U.S. application Ser. No. 08/975,644, filed Nov. 21, 1997, and U.S. Ser. No. 09/275,625, filed Mar. 24, 1999, which are each hereby incorporated by reference in their entirety.

FIELD OF THE INVENTION

The present invention relates to deserializer circuits generally and, more particularly, to a deserializer circuit that may convert a serial data stream to a parallel data stream and/or a serial clock to a byte clock.

BACKGROUND OF THE INVENTION

Referring to FIG. 1, a circuit 10 is shown illustrating a conventional deserializer circuit. The circuit 10 generally comprises a full rate phase-locked loop (PLL) 12, a framer circuit 14 and a deserializer block 16. The deserializer block 16 comprises a high speed shifter 18, a parallel load 20 and a state machine 22. The circuit 10 has high power consumption due to (i) the high speed shifter 18, (ii) the parallel load 20 and (iii) the bit rate operation of the state machine 22 and the framer 14.

Referring to FIG. 2, a circuit 10' illustrates another conventional deserializer circuit. The circuit 10' further comprises a barrel shifter 24 and a register 26. The circuit 10' has a higher operating speed than the circuit 10 due to the implementation of the complex framing function at the parallel word rate (as opposed to bit rate), but has higher latency and still has high power consumption due to (i) the high speed shifter 18', (ii) the parallel load 20' and (iii) the bit rate operation of the state machine 22'. FIG. 3 illustrates the high speed shifter 18 (or 18') comprising a number of flip-flops 30a–30n. Each of the flip-flops 30a–30n is timed by the signal PD_CLK.

The circuit 10 and the circuit 10' both require a high speed shifter 18 (and 18') and high speed parallel load 20 (and 20'), which are difficult to implement at high speeds (e.g., at 1 GHz or higher).

SUMMARY OF THE INVENTION

The present invention concerns an apparatus comprising a first circuit and a deserializer circuit. The first circuit may be configured to present a clock signal and a data signal having a second data rate in response to an input signal having a first data rate. The deserializer circuit may be configured to generate an output signal in response to (i) the clock signal, (ii) the data signal and (iii) one or more select signals.

The objects, features and advantages of the present invention include providing a deserializer circuit that may have (i) a low power consumption that may be due to a non-shifting parallelizing element and/or data buffering and/or (ii) a low latency that may be due to a shift mechanism.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 4:
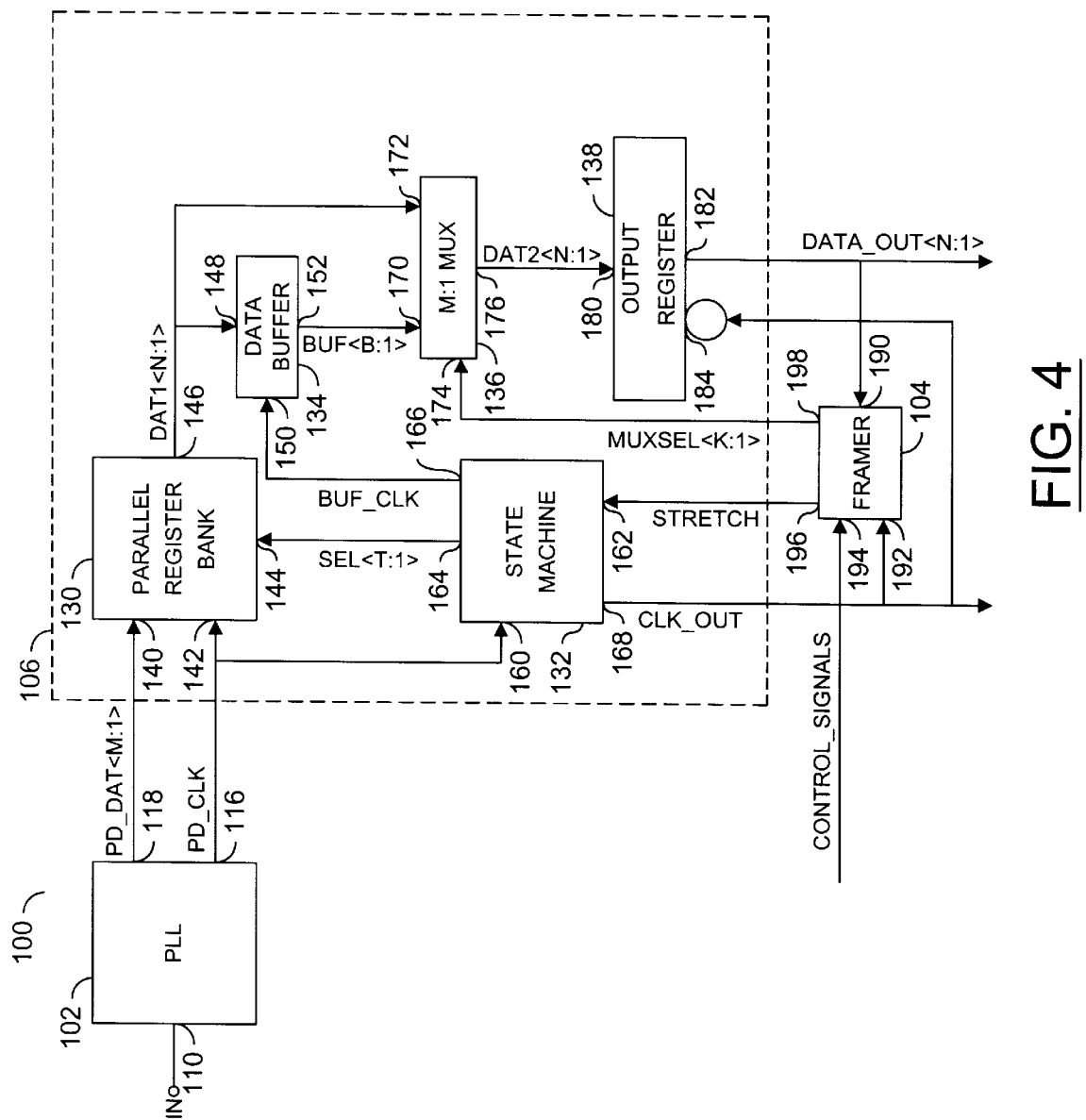
FIG. 4 is a block diagram of a preferred embodiment of the present invention.

Referring to FIG. 4, a block diagram of a circuit 100 is shown in accordance with a preferred embodiment of the present invention. The circuit 100 generally comprises a phase-locked loop (PLL) 102, a framer block (or circuit) 104 and a conversion (or deserializer) block (or circuit) 106. The PLL 102 may be implemented, in one example, as a half rate PLL. The PLL 102 may have an input 110 that may receive an incoming data signal (e.g., a signal IN), an output 116 that may present a clock signal (e.g., a clock signal PD_CLK) and an output 118 that may present a data signal (e.g., a data signal PD_DAT<M:1>).

The conversion circuit 106 generally comprises a parallel register bank 130, a state machine 132, a data buffer 134, a multiplexer 136 and an output register 138. The parallel register bank 130 generally comprises an input 140 that may receive the signal PD_DAT<M:1>, an input 142 that may receive the signal PD_CLK, an input 144 that may receive a signal (e.g., SEL<T:1>representing a number of select bits) and an output 146 that may present a signal (e.g., DAT1<N:1>). The data buffer 134 generally comprises an input 148 that may receive the signal DAT1<N:1>, an input 150 that may receive a signal (e.g., BUF_CLK) and an output 152 that may present a signal (e.g., BUF<B:1>). The state machine 132 generally comprises an input 160 that may receive the signal PD_CLK, an input 162 that may receive a signal (e.g., STRETCH), an output 164 that may present the signal SEL<T:1>, an output 166 that may present the signal BUF_CLK, and an output 168 that may present a signal (e.g., CLK_OUT).

The multiplexer 136 generally comprises an input 170 that may receive the signal BUF<B:1>, an input 172 that may receive the signal DAT1<N:1>, an input 174 that may receive a signal (e.g., MUXSEL<K:1>) and an output 176 that may present a signal (e.g., DAT2<N:1>) In one example, the multiplexer 136 may be implemented as a 2:1 multiplexer. However, an M-bit multiplexer may be implemented in an extended parallel architecture.

The output register 138 generally comprises an input 180 that may receive the signal DAT2<N:1>, an output 182 that may present a signal (e.g., DATA_OUT<N:1>) and an input 184 that may receive the signal CLK_OUT.

The framer 104 generally comprises an input 190 that may receive the signal DATA_OUT<N:1>, an input 192 that may receive the signal CLK_OUT, an input 194 that may receive a multi-bit signal (e.g., CONTROL_SIGNALS), an output 196 that may present the signal STRETCH and an output 198 that may present the signal MUXSEL<K:1>.

The half rate PLL 102 may generate the signal PD_DAT<M:1>and the signal PD_CLK in response to the incoming data stream IN. Since the PLL 102 may use a half rate clock (for example an 800 MHz clock may be used for a 1600 Mbit/s data stream), two data bits may be transferred on each falling clock edge of the clock. The PLL 102 may be implemented, in another example to be described in connection with FIG. 19, as a full rate PLL.

Figure 5:
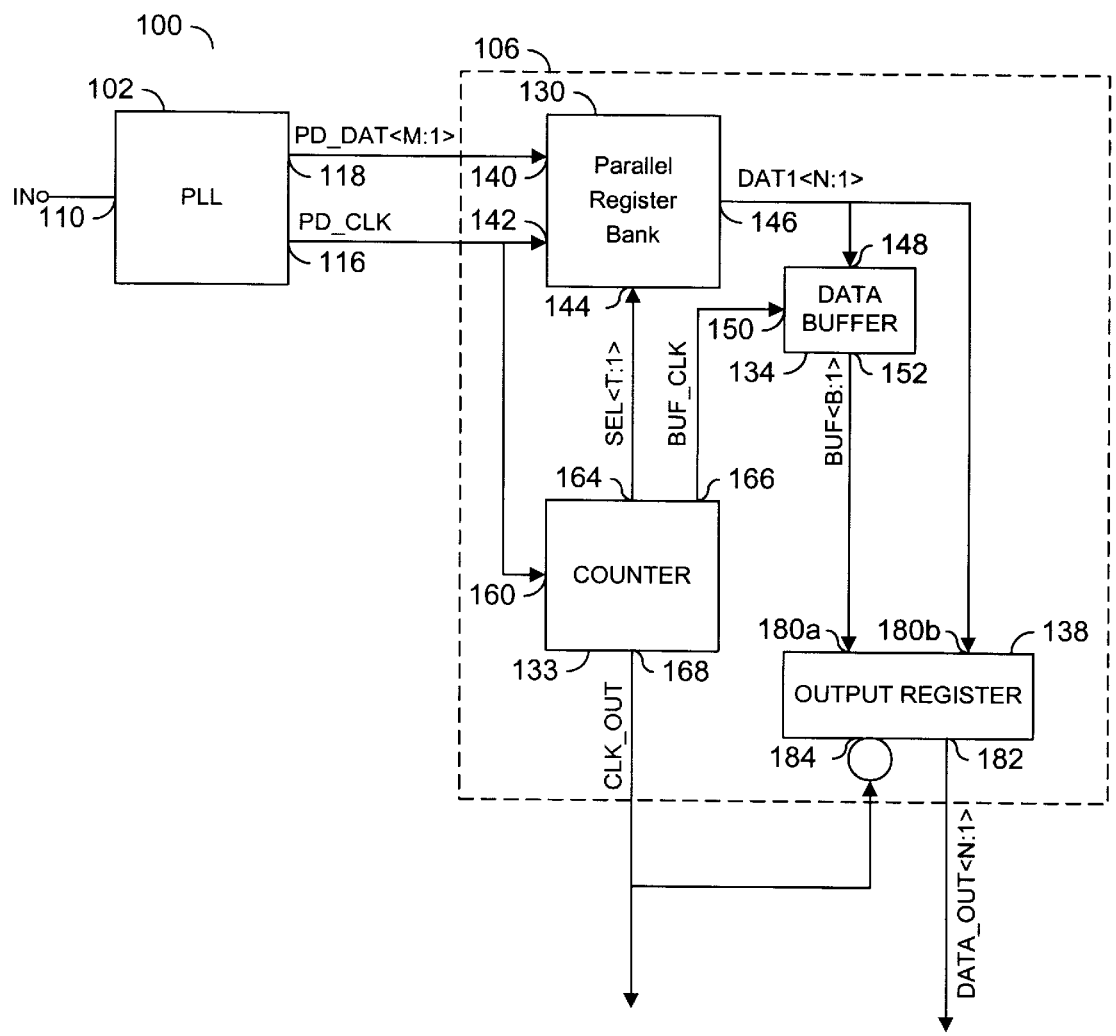
FIG. 5 is a block diagram of an alternate embodiment of the present invention.

Referring to FIG. 5, an alternate implementation of the circuit 100 is shown without the framer 104. The state machine 132 is generally replaced with a counter 133. The counter 133 generally has an input 160 that may receive the signal PD_CLK, an output 164 that may present the signal SEL<T:1>, an output 166 that may present the signal BUF_CLK and an output 168 that may present the signal CLK_OUT. The counter 133 generally presents the select signals SEL<T:1> to the parallel register bank 130 and the signal BUF_CLK to the data buffer 134.

Figure 6:
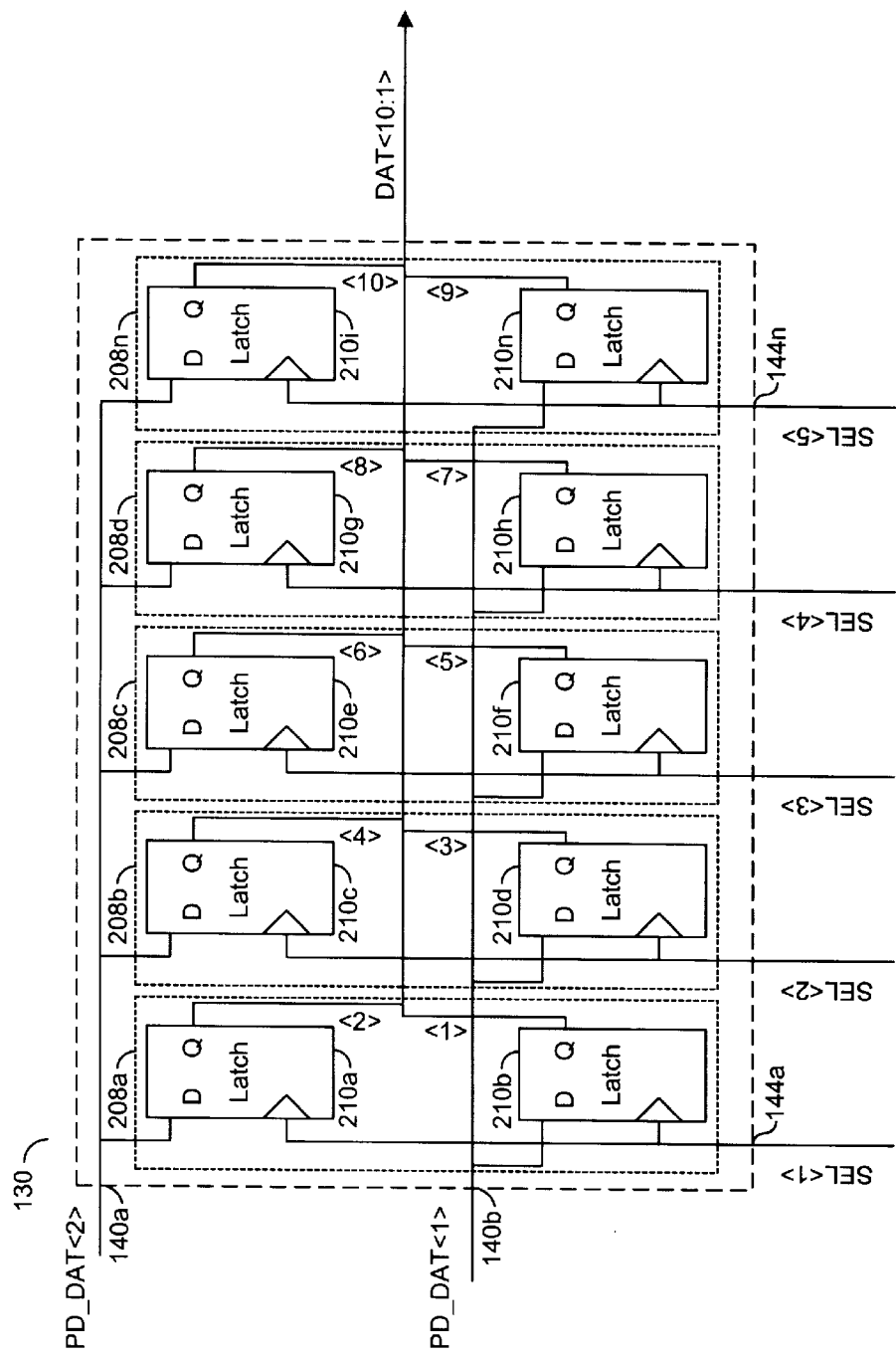
FIG. 6 is a diagram illustrating the parallel register bank of FIGS. 4 and 5.

Referring to FIG. 6, a more detailed diagram of the parallel register bank 130 is shown. The parallel register bank 130 may be implemented as a plurality of register elements 208a–208n. The parallel register bank 130 may load two bits (e.g., PD_DAT<2> and PD_DAT<1>) at a time into the internal register elements 208a–208n. Each of the register elements 208a–208n comprises one or more latches 210a–210n. In one example, the latches 210a–210n may be implemented as D-type latches. However, other latches, such as JK-type latches may be implemented to meet the design criteria of a particular implementation. Each register element 208a–208n generally has an active high enable. For example, a particular register element 208a–208n may be transparent when the latch enable signal (e.g., SEL<1>–SEL<5>) is asserted high. The number of latches 210a–210n may be, in one example, the same as the parallel word width N. In one example, the number of register elements 208a–208n may be equal to N/M, where M is an integer. The outputs of the register elements 208a–208n generally present the signal DAT<N:1>, illustrated as a signal DAT<10:1> for the example where N=10. The particular bits PD_DAT<2> and PD_DAT<1> presented to the register elements 208a–208n and the latch enable signals SEL<1>–SEL<5> illustrate examples of particular bit combinations that may be presented to the register elements 208a–208n. The particular order of the bits of the signals PD_DAT<2>, PD_DAT<1> and the signal SEL<1:5> may be adjusted accordingly to meet the design criteria of a particular implementation.

Figure 7:
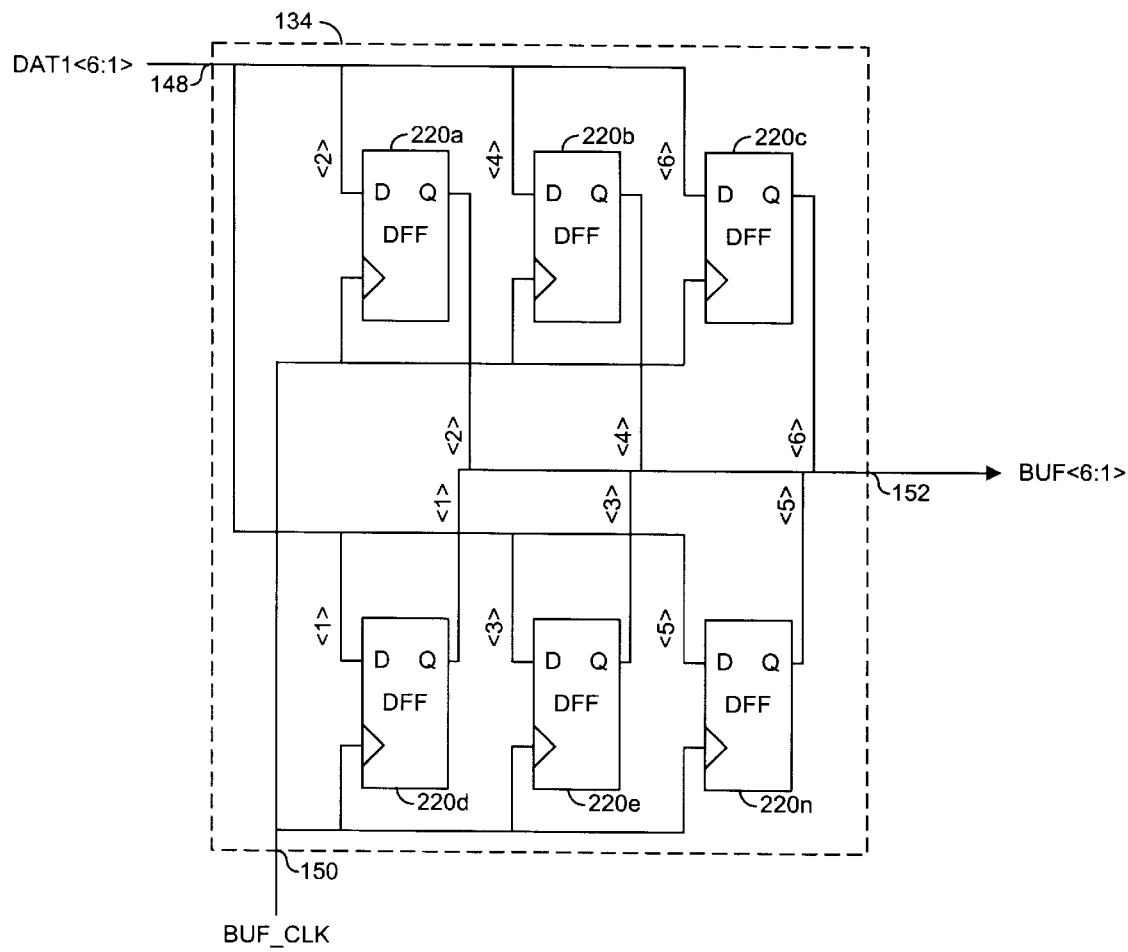
FIG. 7 is a diagram illustrating the data buffer of FIGS. 4 and 5.

Referring to FIG. 7, a more detailed diagram of the data buffer 134 is shown. The data buffer 134 generally comprises a number of memory elements 220a–220n. In one example, the memory element 220a–220n may be implemented as D-type flip-flops. However, other flip-flops, such as JK-type flip flops, may be implemented to meet the design criteria of a particular implementation. In an example where N=10, a portion of the signal DAT1<N:1> may be a 6-bit signal, generally represented as DAT1<6:1>. A first bit <1> of the signal DAT1<6:1> may be presented to the D input of the flip-flop 220d, a second bit <2>may be presented to the D input of the flip-flop 220a, a third bit <3> may be presented to the D input of the flip-flop 220e, a fourth bit <4>may be presented to the D input of the flip-flop 220b a fifth bit <5>may be presented to the D input of the flip-flop 220n and a sixth bit <6>may be presented to the D input of the flip-flop 220c. The outputs of each of the flip-flops 220a–220n may be combined to present the multi-bit signal BUF<6:1>. Additionally, each of the flip-flops 220a–220n may receive the signal BUF_CLK at the respective clock inputs. The order of the bits of the multi-bit signal BUF<6:1> presented to the particular flip-flops 220a–220n may be adjusted accordingly to meet the design criteria of a particular implementation.

The data buffer 134 may ensure that the signal DAT1<N:1>is transferred correctly from the parallel register bank 130 to the output register 138. Each output may update a state on the rising edge of the signal BUF_CLK. The data buffer 134 may temporarily store the least significant bits (e.g., LSBs) of the signal DAT1<N:1>, which may allow the output register 138 to cleanly update while the LSBs of the parallel register bank 130 are changing. Alternately, the data buffer 134 may store the most significant (e.g., MSBs) of the signal DAT1<N:1>.

Figure 8:
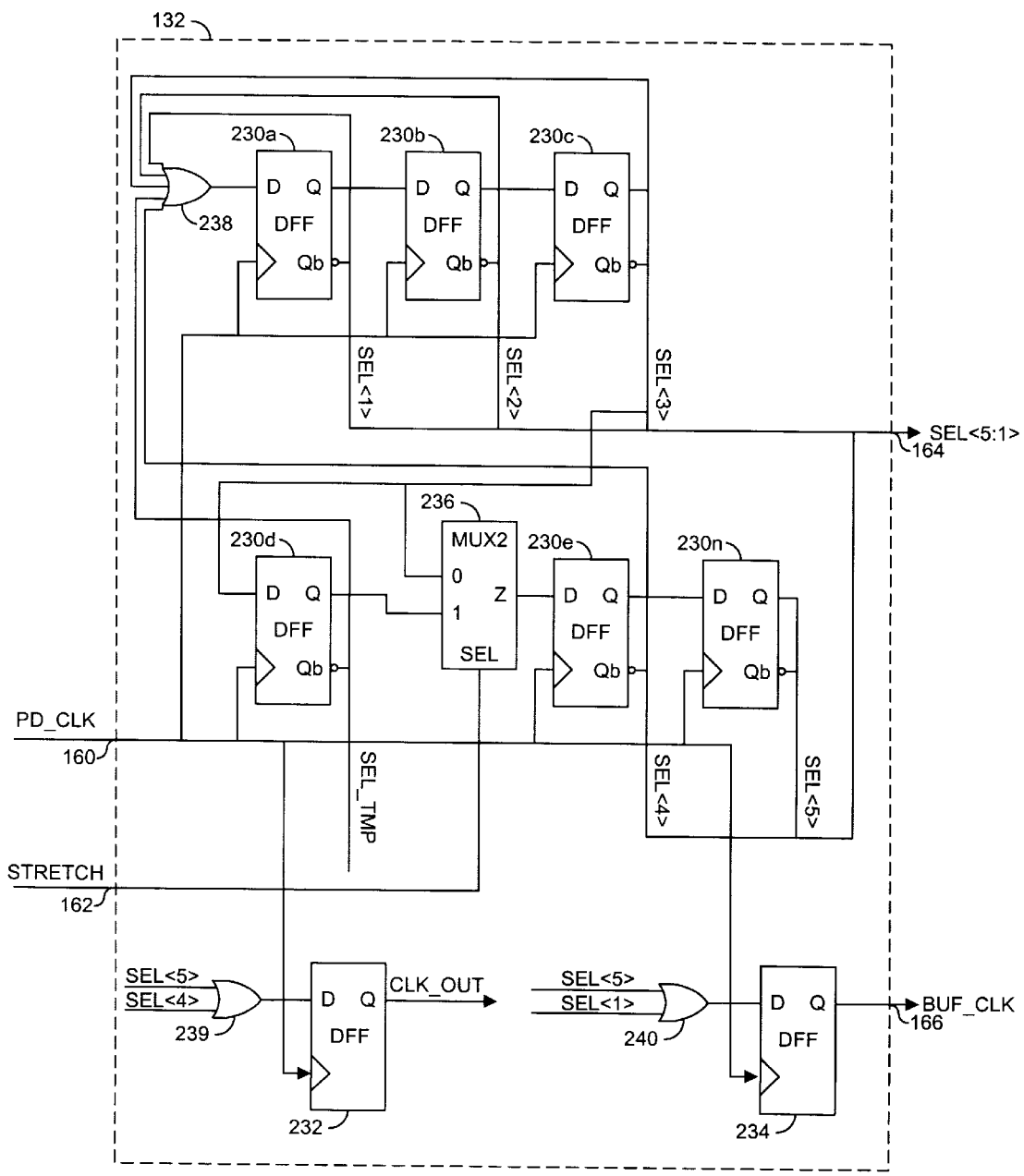
FIG. 8 is a diagram illustrating an example of the state machine of FIG. 4.

Referring to FIG. 8, a more detailed diagram of the state machine 132 is shown. The state machine generally comprises a number of flip-flops 230a–230n, a flip-flop 232, a flip-flop 234, a multiplexer 236, a gate 238, a gate 239 and a gate 240. In one example, the gate 238 may be an OR gate. The gate 238 generally receives an input from each of the flip-flops 230a–230e. The output of the flip-flops 230a–230n are generally combined to present the select signal SEL<5:1>. Additionally, each of the flip-flops 230a–230n and the flip-flops 232 and 234 generally receive the signal PD_CLK at their respective clock inputs. The multiplexer 236 generally has a first input that receives the signal SEL<3> and a second input that receives the output (e.g., SEL_TMP) of the flip-flop 230d. The select input of the multiplexer 236 generally receives the signal STRETCH. The flip-flop 232 generally has a D input that receives a signal from a gate 239. In one example, the gate 239 may be an OR gate. The gate 239 generally receives the signal SEL<5>and the signal SEL<4>. Similarly, the flip-flop 234 has a D input that generally receives a signal from a gate 240. In one example, the gate 240 may be implemented as a OR gate. The gate 240 generally has a first input that receives the signal SEL<5>and a second input that receives the signal SEL<1>. The flip-flop 232 generally presents the signal CLK_OUT and the flip-flop 234 generally presents the signal BUF_CLK. The bits of the signal SEL<5:1> presented to the flipflops 230a–230n, the gate 238 and the gate 240 are examples of a particular arrangement of the select bits SEL<5:1>. Other combinations of the select bits SEL<5:1> may be implemented accordingly to meet the design criteria of a particular implementation.

The state machine 132 generally controls the update process of the parallel register bank 130, the data buffer 134 and the output register 138. The state machine 132 may be implemented, in one example, as a rotating '0' ring counter. The signals SEL<T:1> may be derived by inverting the outputs of the flip-flops 230a–230n. The signal BUF_CLK and the signal CLKOUT may be derived by gating (i) the outputs of the flip-flops 230e and 230n for the signal CLK_OUT and (ii) the outputs of the flip-flops 230a and 230n for the signal BUF_CLK. The resultant signals may be retimed through the flip-flops 232 and 234 to avoid glitches on the output signals CLK_OUT and BUF_CLK. The state of the state machine 132 may be updated on the rising edge of the signal PD_CLK.

Under normal operating conditions, the state machine 132 may be a simple rotating 0 ring counter of a length T. When the signal STRETCH is asserted, the ring counter may be adjusted to a new length (e.g., T+1), which may effectively shift the relative position of the signal DATA_OUT with respect to the signal CLK_OUT by two bit times of each cycle of the signal CLK_OUT. The length T may be a first fixed period and the length T+1 may be a second fixed period. The flip-flop 230d may present a signal SEL_TMP.

Figure 9:
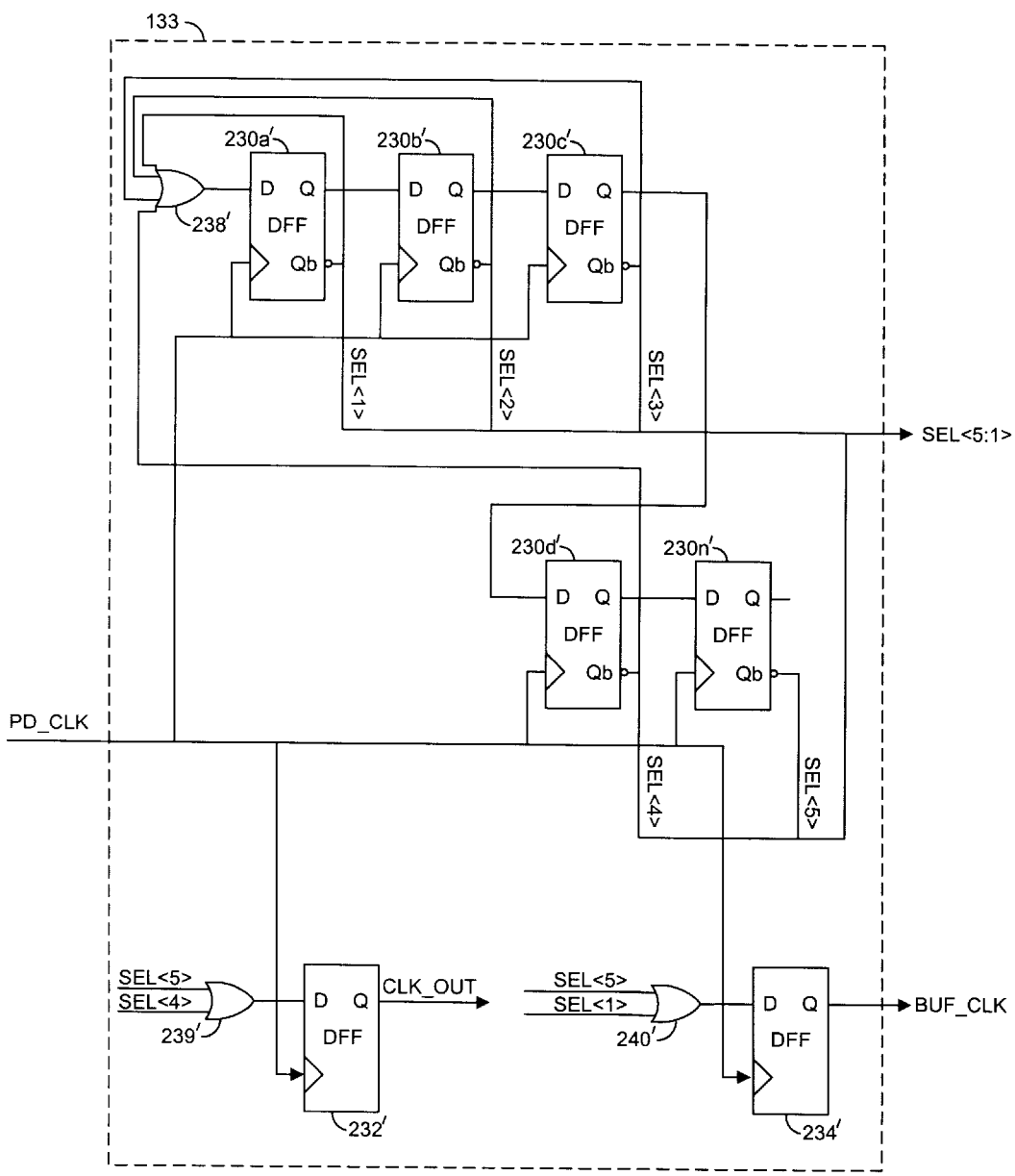
FIG. 9 is a diagram illustrating the counter 133 of FIG. 5.

Referring to FIG. 9, a more detailed diagram of the counter 133 is shown. The counter 133 has a similar implementation as the state machine 132. For example, a number of flip-flops 230a'–230n' may correspond to the flip-flops 230a–230n. Additionally, the gates 238', 239' and 240' may be configured similarly to the gates 238, 239 and 240 of FIG. 8. However, the counter 133 does not generally have the multiplexer 236, the flip-flop 230d or the input STRETCH.

Figure 10:
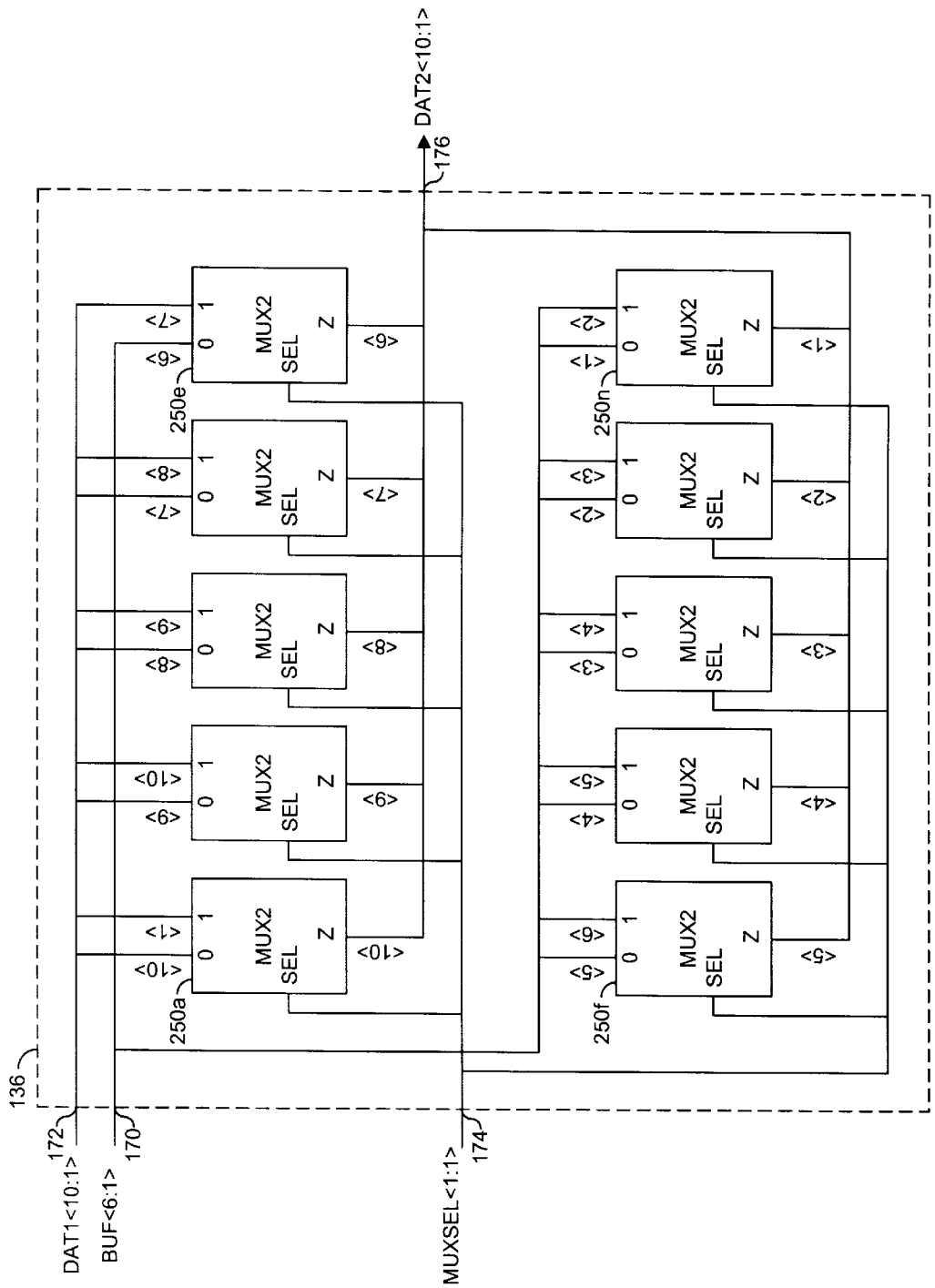
FIG. 10 is a diagram illustrating an example of the multiplexer of FIG. 4.

Referring to FIG. 10, a more detailed diagram of the multiplexer 136 is shown. The multiplexer 136 generally comprises a number of multiplexers 250a–250n. Each of the multiplexers 250a–250n generally receives the signal MUXSEL<K:1> at a select input. The multiplexer 250e generally receives a bit (e.g., <6>) of the signal BUF<6:1> at one input and a bit (e.g., <7>) of the signal DAT1<10:1> at another input. The multiplexers 250a–250d each generally receive two bits of the signal DAT1<10:1> at their respective first and second inputs. The multiplexer 250e may receive one bit of the signal DAT1<10:1> and one bit of the signal BUF<6:1>. The multiplexers 250f–250n each generally receive two bits of the signal BUF<6:1> at their respective first and second inputs. The particular bits of the signals DAT1<10:1> and BUF<6:1>may be adjusted accordingly to meet the design criteria of a particular implementation. The outputs of the multiplexers 250a–250n are generally combined to present the signal DAT2<10:1>.

Figure 11:
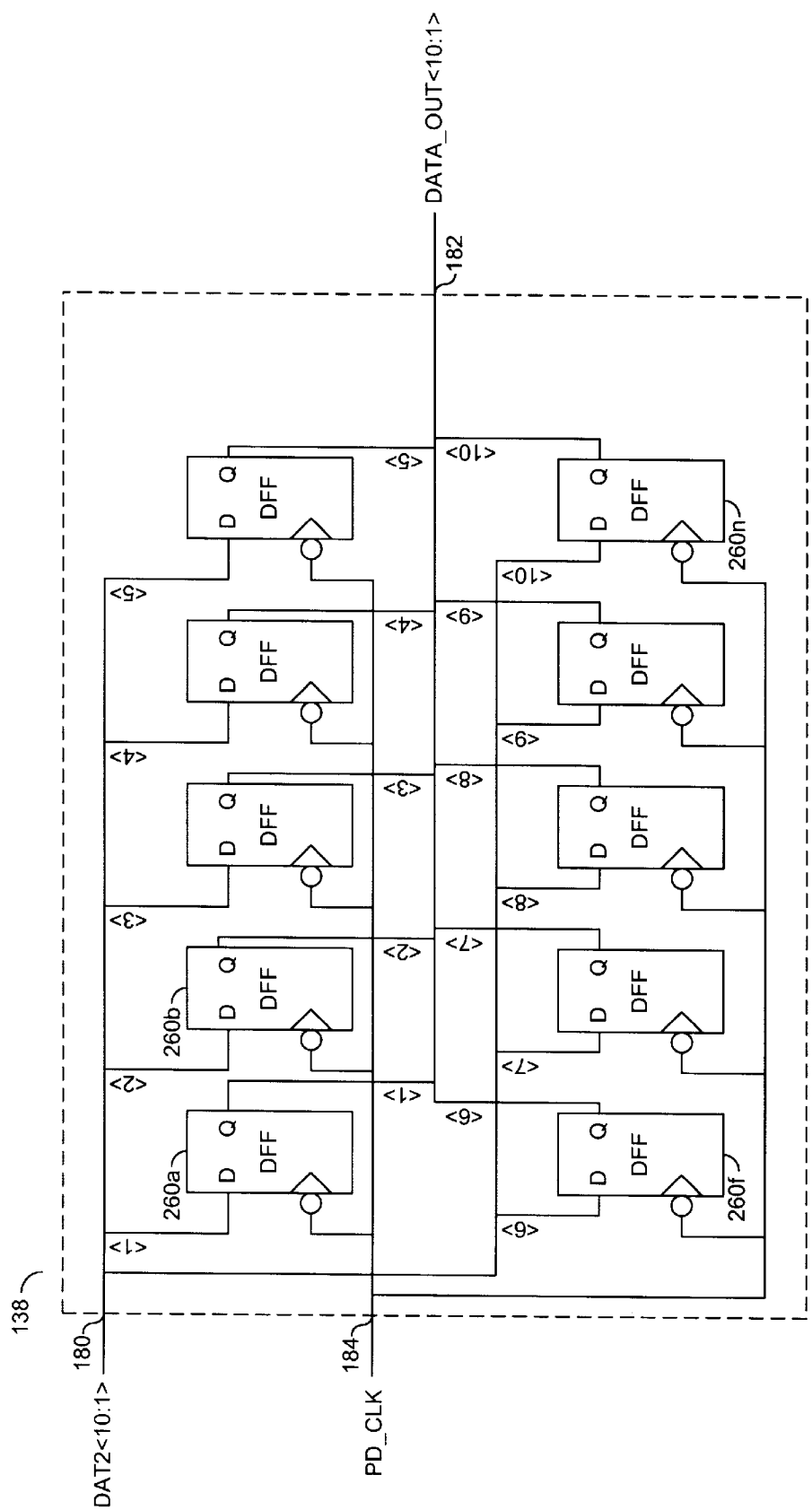
FIG. 11 is a diagram illustrating an example of the output register of FIGS. 4 and 5.

Referring to FIG. 11, a more detailed diagram of the output register 138 is shown. The output register 138 generally comprises a number of memory elements 260a–260n. The memory elements may be implemented, in one example, as D-type flip-flops. In another example, the memory elements 260a–260n may be implemented as JK-type flip-flops. The signal CLK_OUT is generally presented to the clock input of each of the flip-flops 260a–260n. In one example, the signal CLK_OUT may be inverted before being presented to the clock inputs. A D input of each of the flip-flops 260a–260n generally receives one of the bits of the signal DAT2<10:1>. For example, the flip-flop 206a may receive the bit <1>, the flip-flop 260b may receive the bit <2>, etc. The Q outputs of the flip-flops 260a–260n may each present a bit of the signal DATA_OUT<10:1>. The particular bits of the signal DAT2<10:1> presented to the particular flip-flops 260a–260n may be adjusted accordingly to meet the design criteria of a particular implementation.

The multiplexer 136 generally introduces an extra 1-bit shift so that the data stream can be adjusted to a single bit resolution. The output register 138 may simply retime the data. The output register 138 may update on the falling edge of the signal CLK_OUT.

Figure 1:
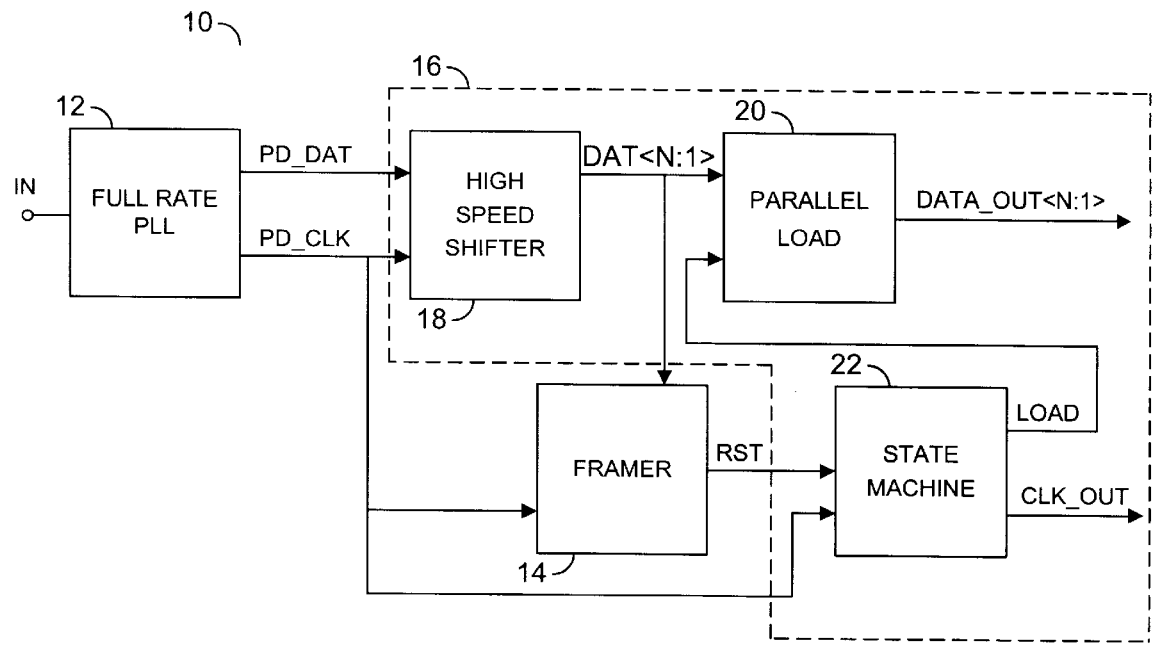
FIG. 1 is a block diagram of a conventional deserializer circuit.
Figure 12:
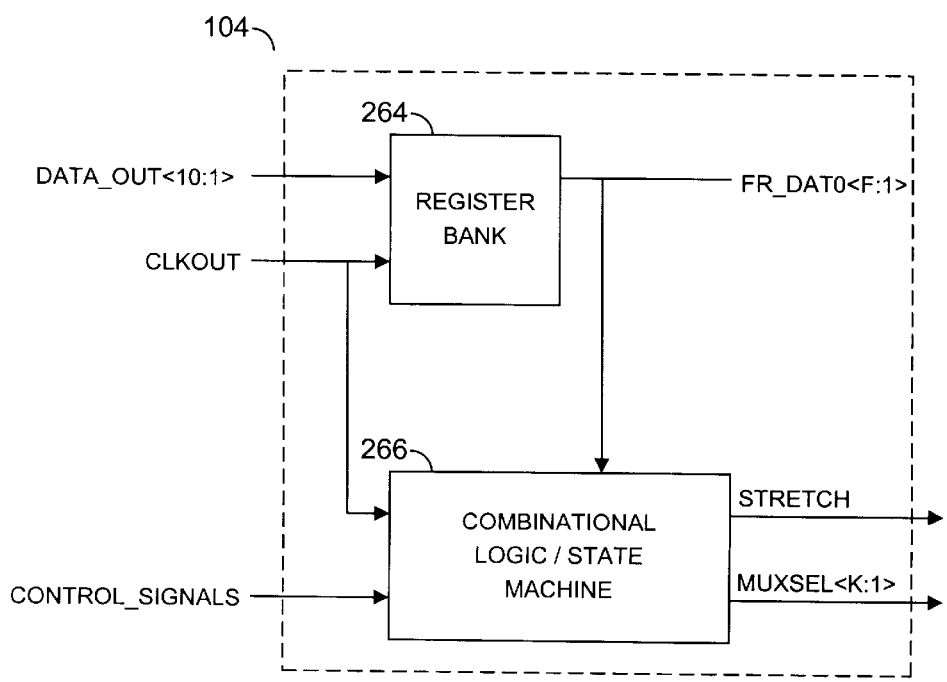
FIG. 12 is a diagram illustrating the framer of FIG. 4.
Figure 2:
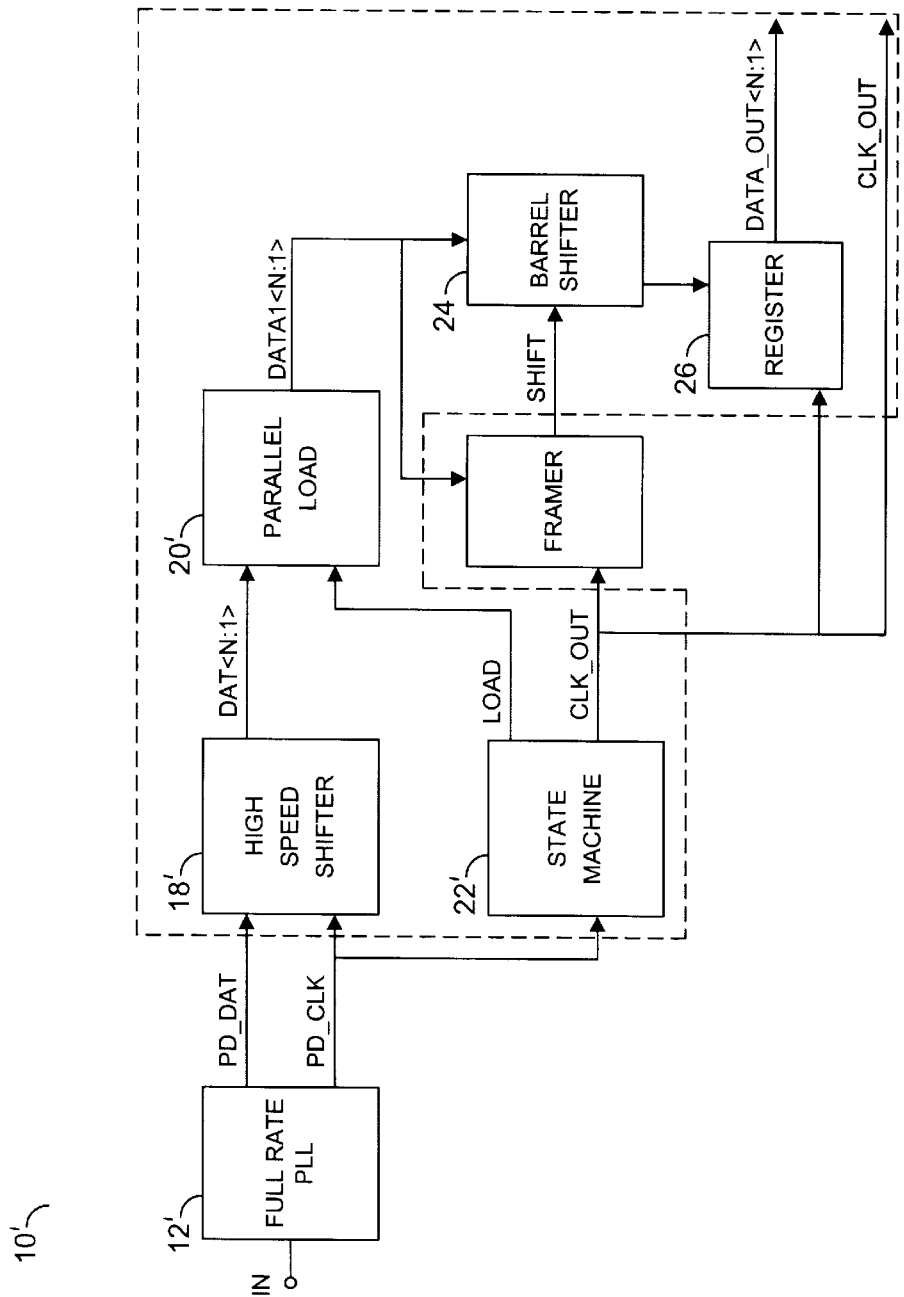
FIG. 2 is a block diagram of another conventional eserializer circuit.
Figure 3:
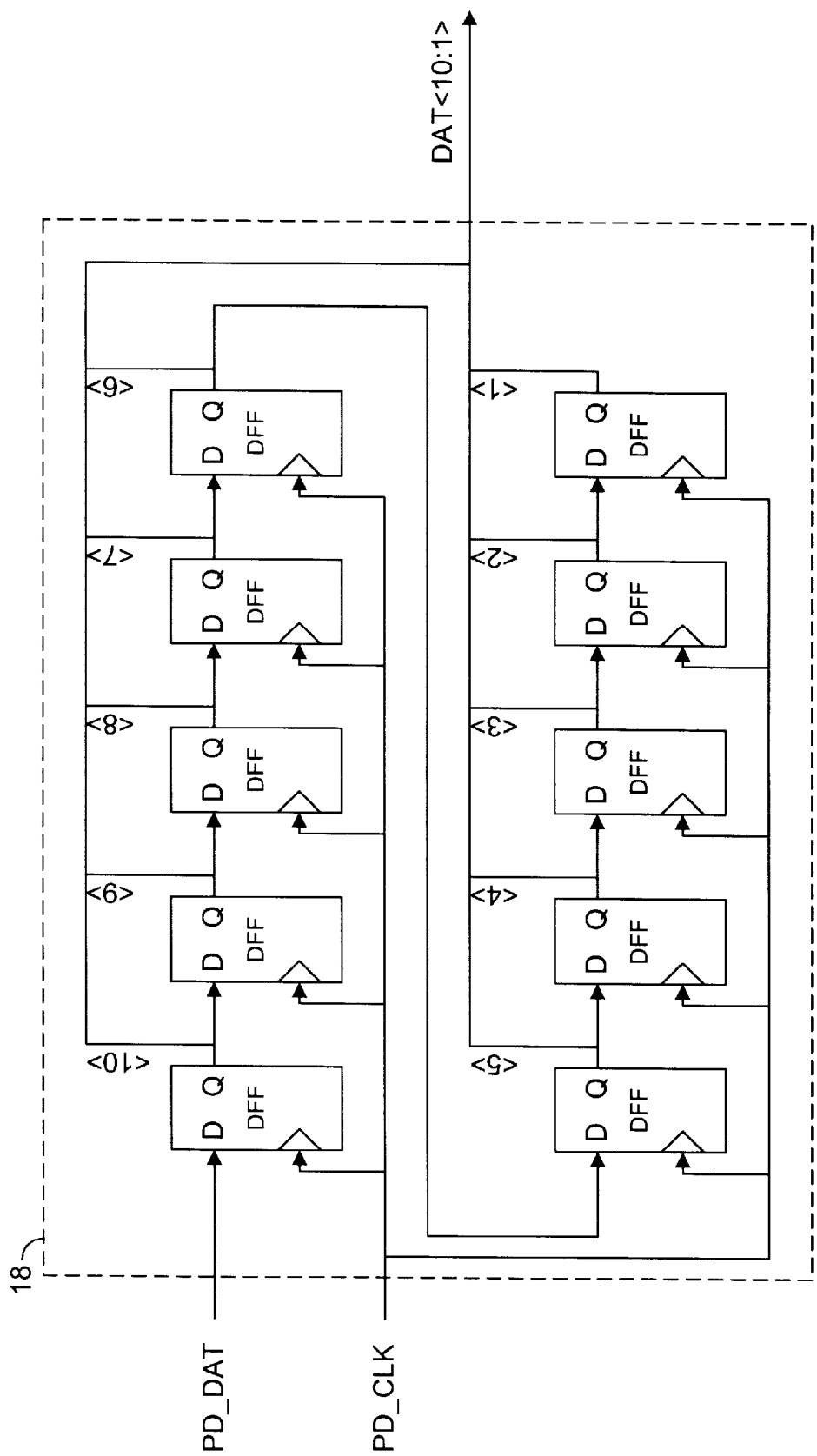
FIG. 3 illustrates the high speed shifter of FIGS. 1 and 2.

Referring to FIG. 12, an example of the framer circuit 104 is shown. The framer circuit 104 generally comprises a register bank 264 and a combinational logic/state machine 266. The state machine 266 generally presents the signal STRETCH and the signal MUXSEL<K:1> in response to the signal CLKOUT. The signal CONTROL_SIGNALS and the signal FR_DAT0<F:1>. Additional examples of the framer circuit may be found in co-pending U.S. application Ser. No. 08/976,072, filed Nov. 21, 1997, U.S. application Ser. No. 08/975,644, filed Nov. 21, 1997 and U.S. application Ser. No. 09/275,625, filed Mar. 24, 1999, which are each hereby incorporated by reference in their entirety. Depending on the application, the circuit 100 may be controlled to frame to a Fiber Channel K28.5 framing character, multiple K28.5 framing characters, or any other arbitrary framing character.

Figure 13:
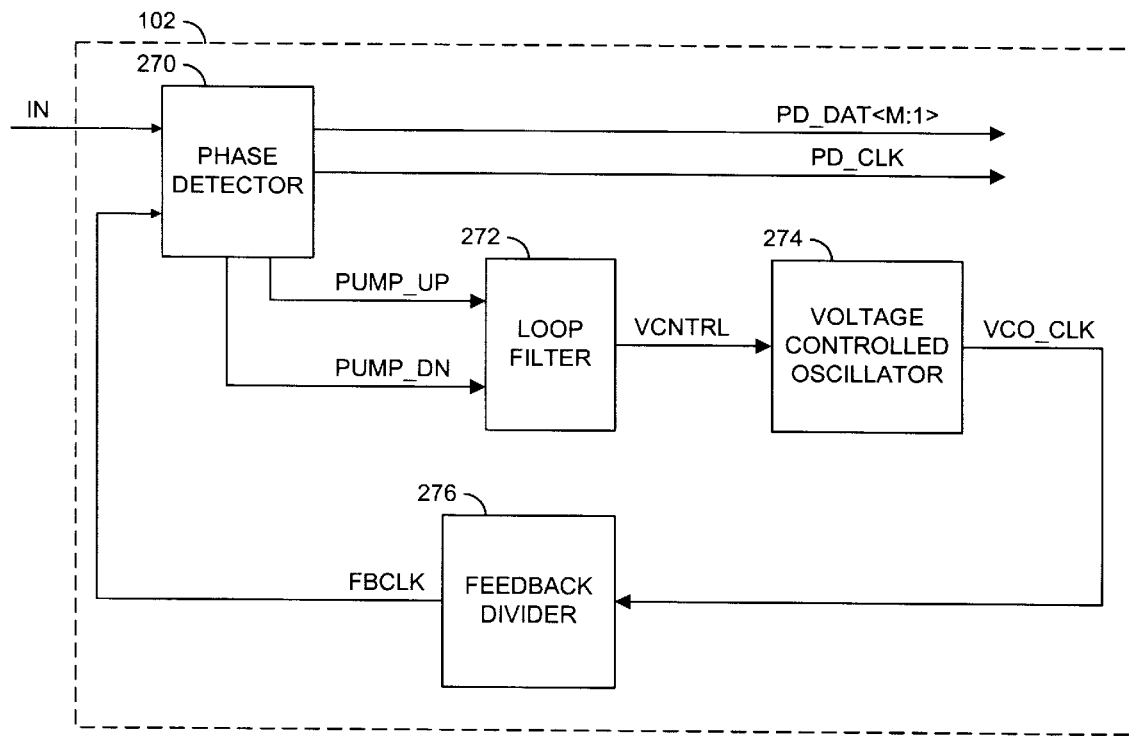
FIG. 13 is a diagram illustrating a typical clock/data recovery PLL.

Referring to FIG. 13, an example of a clock/data recovery PLL 102 used in FIGS. 4 and 5 is shown. A phase detector 270 may present a recovered data signal and a recovered clock signal as well as a pump_up and a pump_down signal to a loop filter 272. The loop filter may present a control signal to a VCO 274. The VCO 274 may present a clock signal VCO_CLK to a feedback divider 276. The feedback divider 276 may present a feedback clock signal FBCLK to the phase detector 270. The feedback divider 276 is an optional component that may not be required in certain design implementations. The PLL 102 may also include a phase frequency detector (not shown) that may be useful in certain design applications.

Figure 14:
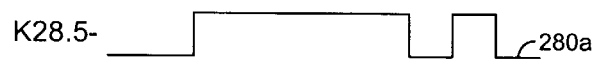
FIG. 14 is a diagram illustrating the waveforms of FIG. 13.
Figure 14:

Referring to FIG. 14, an example of two Fiber Channel K28.5 characters (280a and 280b) are shown. The character 280a generally corresponds to negative running disparity and the character 280b generally corresponds to positive running disparity. Each character 280a and 280b is shown comprising a 10-bit character. The characters 280a and 280b are commonly used in Fiber Channel applications as frame alignment characters. The size of the register bank 264 of FIG. 12 depends upon the length of the framing character. For some Fiber Channel applications, a single 10-bit character is sufficient, which may require at least 10 register bits in the register bank 264. For other Fiber Channel applications, two K28.5 characters within 5 data bytes may be required for framing, which may require at least 50 register bits.

Figure 15:
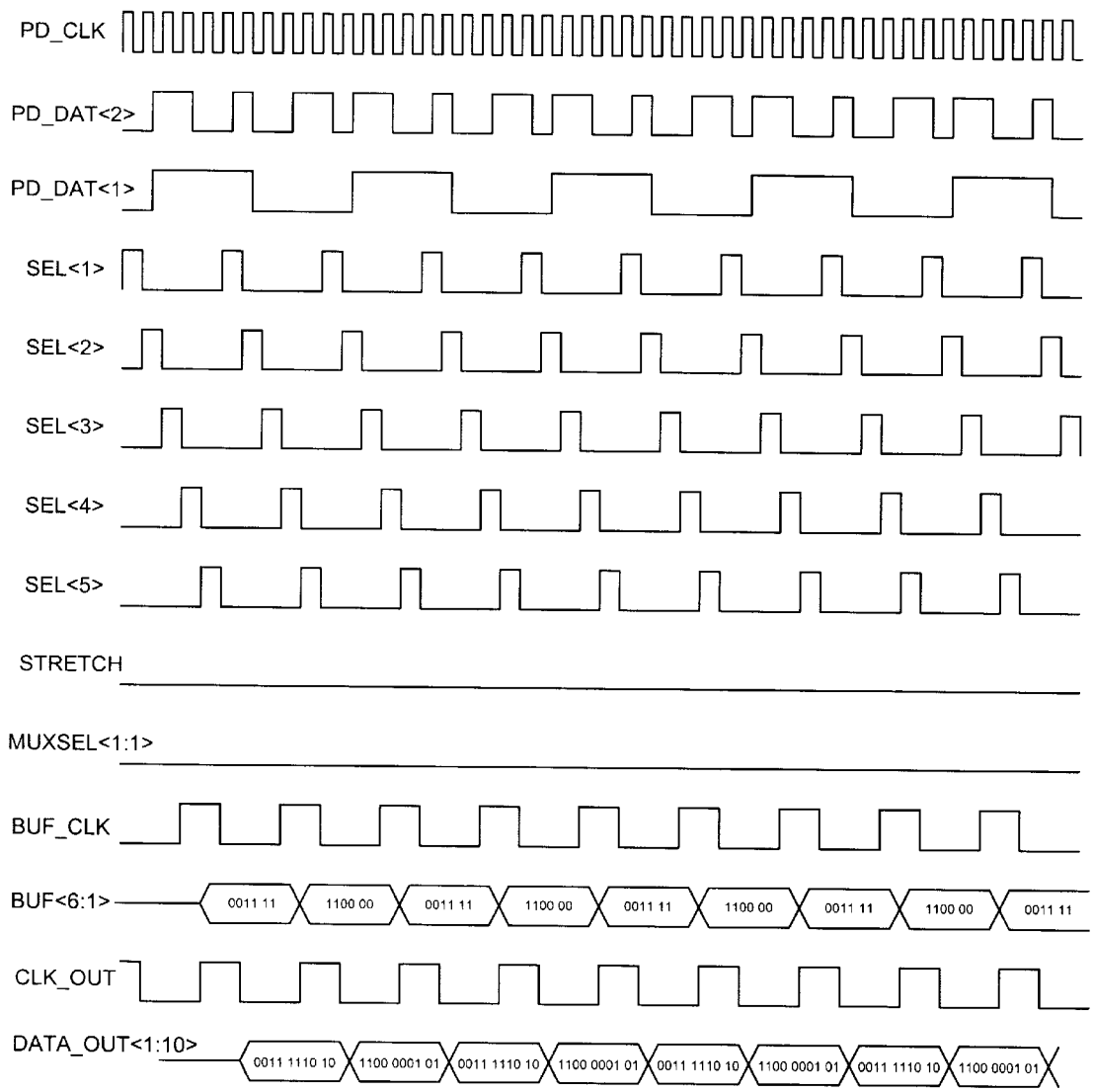
FIG. 15 is a diagram illustrating the waveforms of FIG. 4.

Referring to FIG. 15, a normal mode timing diagram is shown illustrating the details of the operation of the circuit 100 in the example where N=10, M=2, T=5 and B=6. The signals SEL<5:1>are shown as a rotating '1' (e.g., a positive pulse occurs on each successive bit of the signal SEL<5:1> on each positive transition of the signal PD_CLK). The signal STRETCH is generally held low for normal operation. The signal MUXSEL<1:1> is generally held static for normal operation (however, the signal MUXSEL<1:1> may be implemented to be held high by reversing the polarity). The signal BUF<6:1> is generally updated on the rising edge of the signal BUF_CLK. The signal BUF<2:1> is the data sampled by the parallel register bank 130 on the falling edge of the signal SEL<l>. Similarly, the bits BUF<4:3> generally correspond to the signal SEL<2>, and the bits BUF<6:5> generally correspond to the signal SEL<3>. The signal DATA_OUT<10:1> is generally updated on the falling edge of the signal CLK_OUT. Since the signal MUXSEL<1:1>is low, the signal DATA_OUT generally comprises the data held in the parallel register bank 130 sampled with SEL<5>, SEL<4>, and the 6 LSBs correspond to BUF<6:1>. If the signal MUXSEL<1:1> were high (e.g., the data word would be shifted by one bit), the signal DATA_OUT would generally comprise one bit (e.g., PD_DAT<1>) of the data stored in the parallel register bank 130 on the falling edge of the signal SEL<0>, the data the parallel register bank 130 is generally sampled with the signal SEL<5>, the signal SEL<4>, and the five LSBs correspond to the signal BUF<6:2>.

Figure 16:
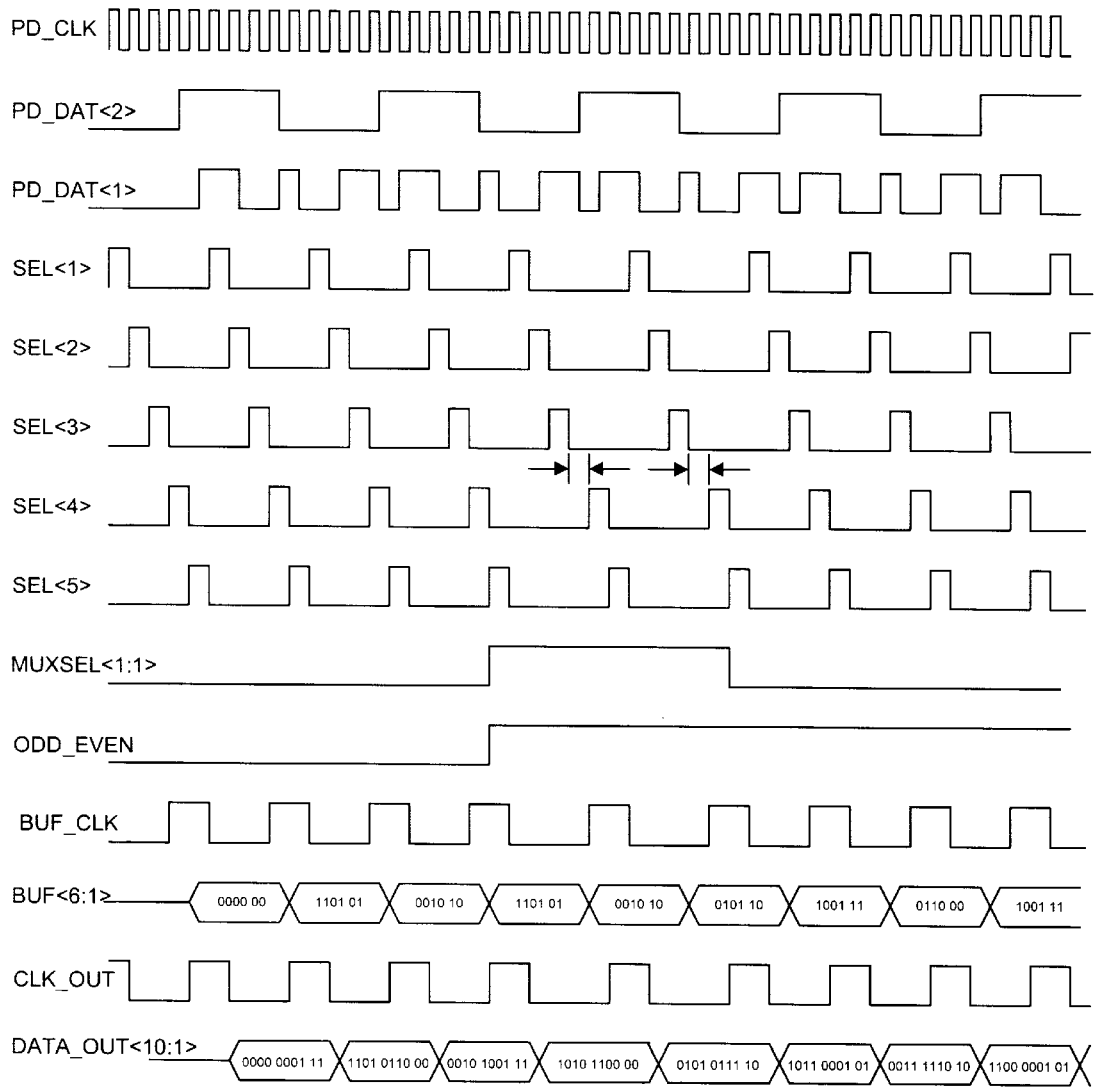
FIG. 16 is a diagram illustrating the waveforms of FIG. 4 when operating in a stretch mode.

Referring to FIG. 16, a stretch mode timing diagram illustrating the details of the framing operation is shown. The signal STRETCH may be held high for two cycles of the signal CLK_OUT as the signal MUXSEL<1:1> changes from 0 to 1. This may result in a net shift of 5 bits. As is shown in FIG. 16, the signal SEL<4> is generally delayed by one cycle of the signal PD_CLK for each cycle of the signal CLK_OUT that the signal STRETCH is held high. In one example, the delay may be generated by asserting the signal SEL_TMP. As illustrated by the signal DATA_OUT<10:1>, the data generally adjusts from K28.5 characters that are out of phase to the K28.5 characters that are in phase.

The invention may provide a low power implementation due to the non-shifting parallelizing element and appropriate use of data buffering. The invention has low latency due to the implementation of the shift mechanism.

Figure 17:
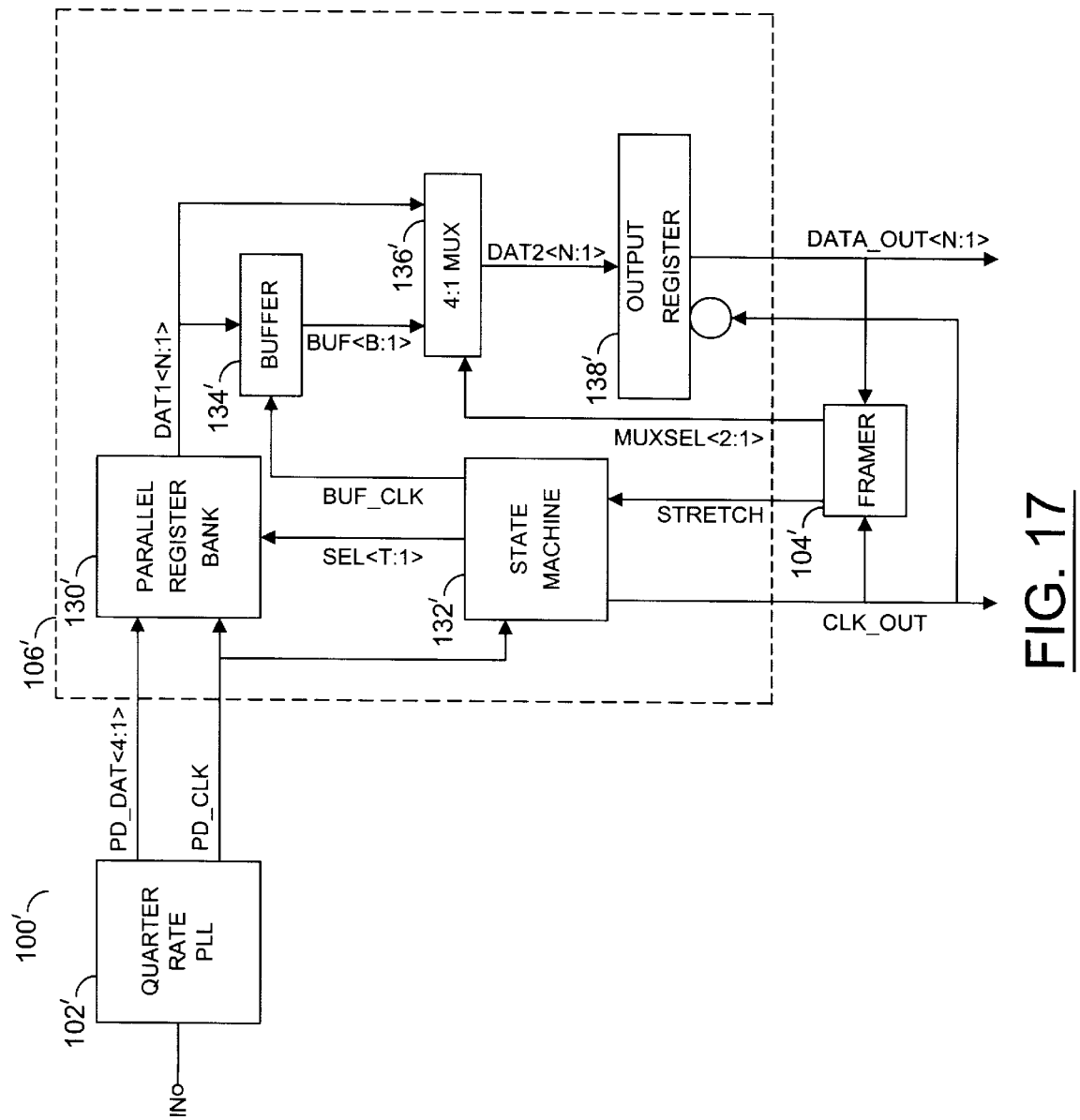
FIG. 17 is another alternate embodiment of the present invention.
Figure 18:
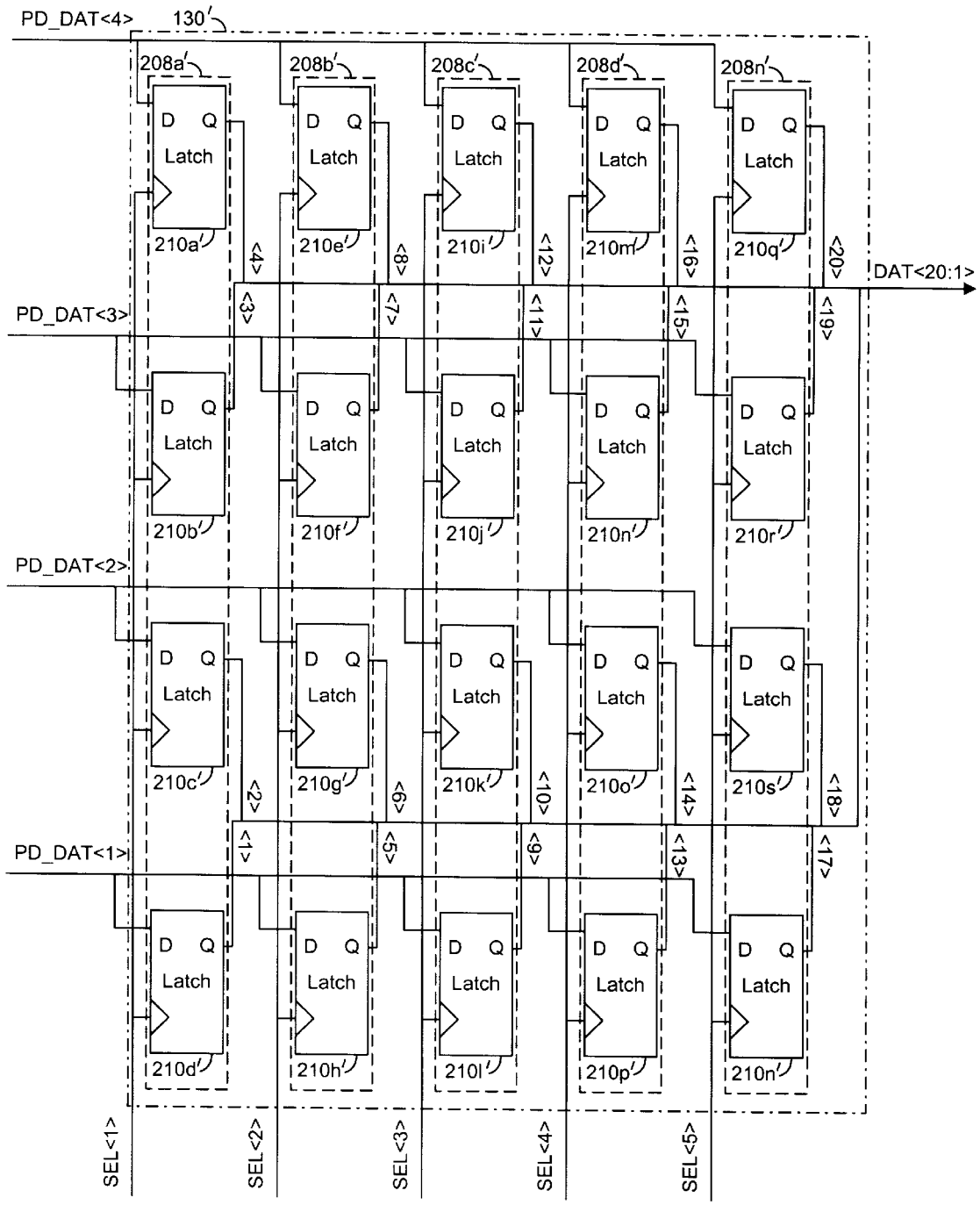
FIG. 18 is a diagram illustrating the parallel register bank of FIG. 17.

The present invention may be extended to more degrees of internal parallelism. For example, a one-quarter rate PLL 102 may be implemented, with a 4-deep parallel register bank 130 and a 4:1 multiplexer 136. FIG. 17 illustrates a circuit 100' illustrating such an alternate embodiment. In another example, the PLL 102' may be implemented as a 1/M rate phase detector, the parallel register bank 130' may be implemented with a total of N latches 210a'–210n' and N/M number of register banks 208a'–208n'. The multiplexer 136 may be implemented as a M:1 multiplexer, where N and M are integers greater than 1 that may be the same or different. Referring to FIG. 18, an alternate example of the parallel register bank 130 is shown where N equals 20 and M equals 4.

Figure 19:
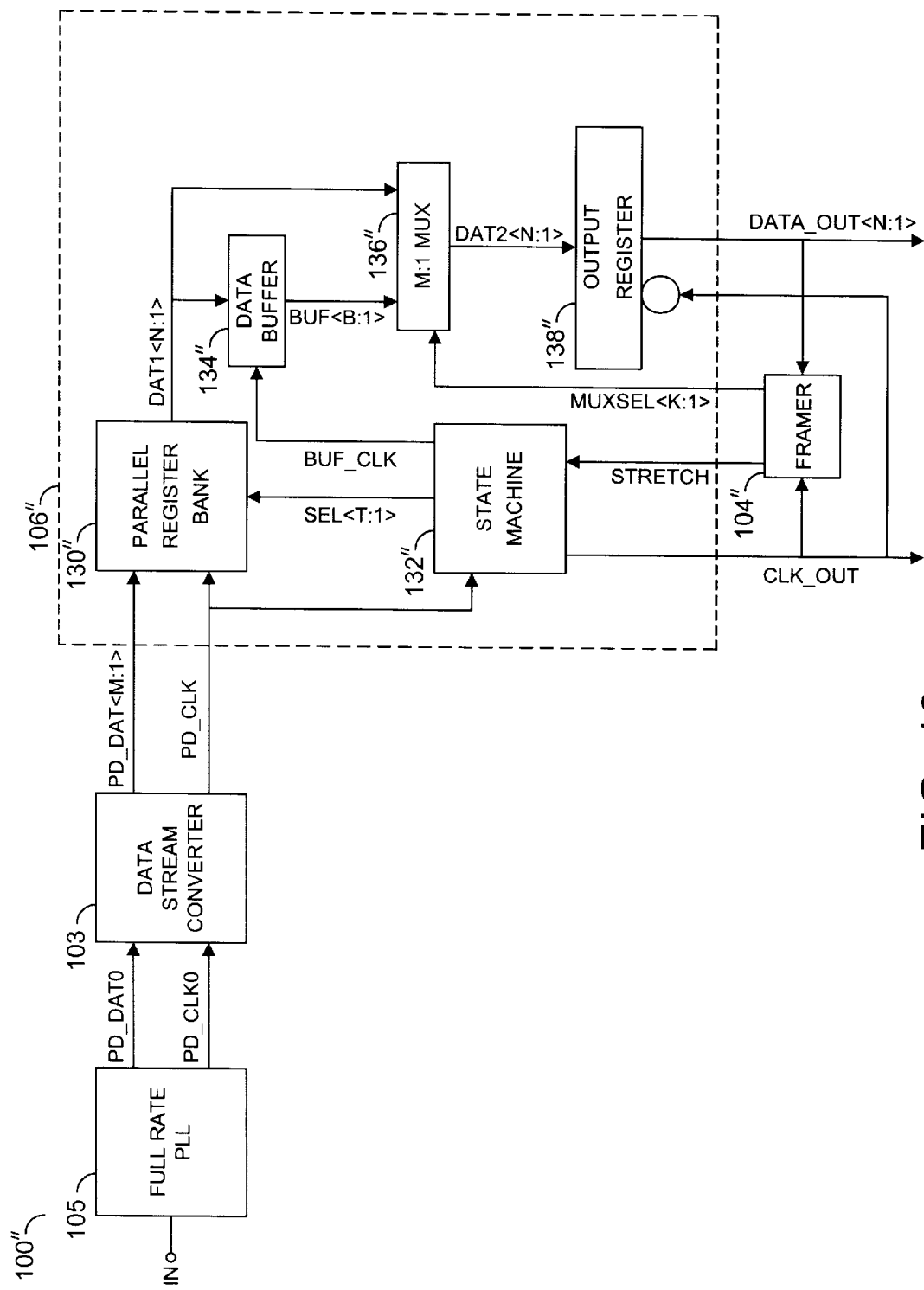
FIG. 19 is another alternate embodiment of the present invention.
Figure 20:
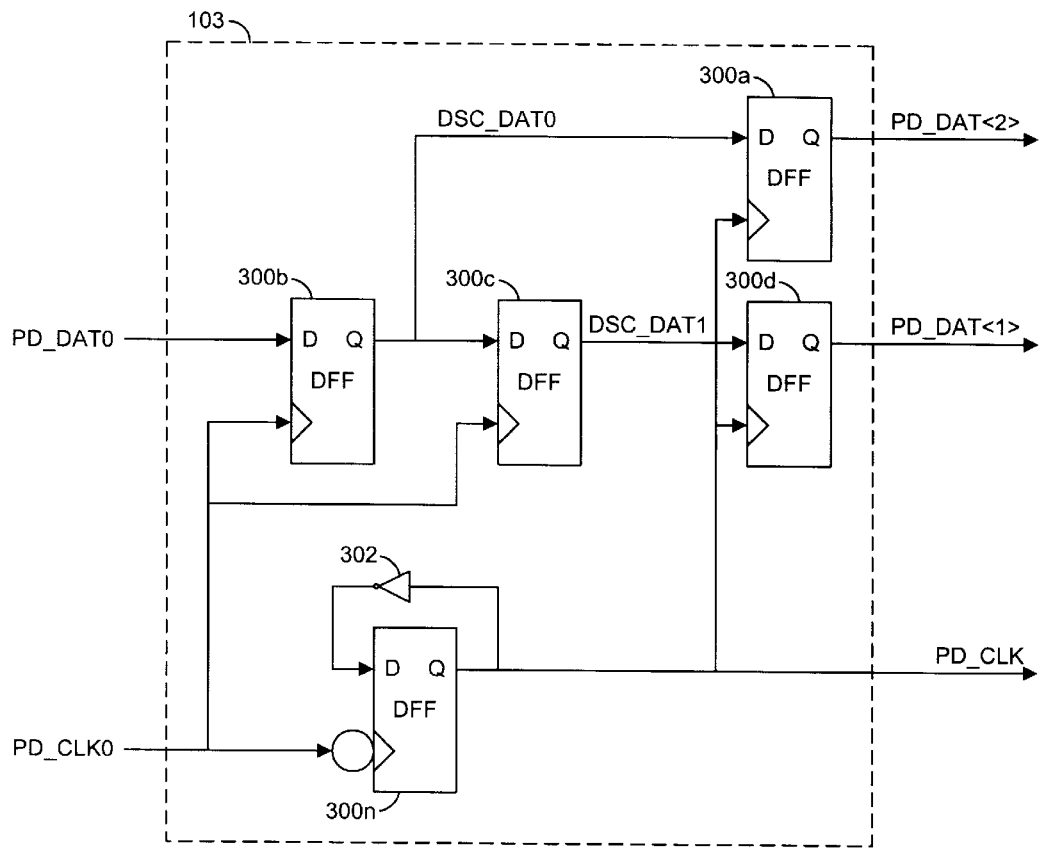
FIG. 20 is a more detailed diagram of the data stream converter circuit of FIG. 19.

Referring to FIG. 19, an example of a circuit 100" implementing an alternate embodiment of the present invention with a PLL 102 and a data stream converter 103. Referring to FIG. 20, an example of a data stream converter 103 is shown. The data stream converter 103 generally comprises a number of flip-flops 300a–300n. In one example, the flip-flops 300a–300n may be implemented as D-type flip-flops. However, other flip-flops, such as JK-type flip-flops may be implemented accordingly to meet the design criteria of a particular implementation.

The flip-flop 300b generally receives the signal PD_DAT0 at a D input and the signal PD_CLK0 at the clock input. The flip-flop 300c also receives the signal PD_CLK0 at the clock input. The flip-flop 300n generally receives a digital complement of the signal PD_CLK0 at the clock input. The Q output of the flip-flop 300b is generally presented to the D input of the flip-flop 300c as well as to the D input of the flip-flop 300a. The Q output of the flip-flop 300n is generally presented to the clock inputs of the flip-flops 300a and 300d, as well as to the D input of the flip-flop 300n, through an inverter 302. The flip-flop 300a generally presents the signal PD_DAT<2>, the flip-flop 300d generally presents the signal PD_DAT<1> and the flip-flop 300n generally presents the signal PD_CLK.

Figure 21:
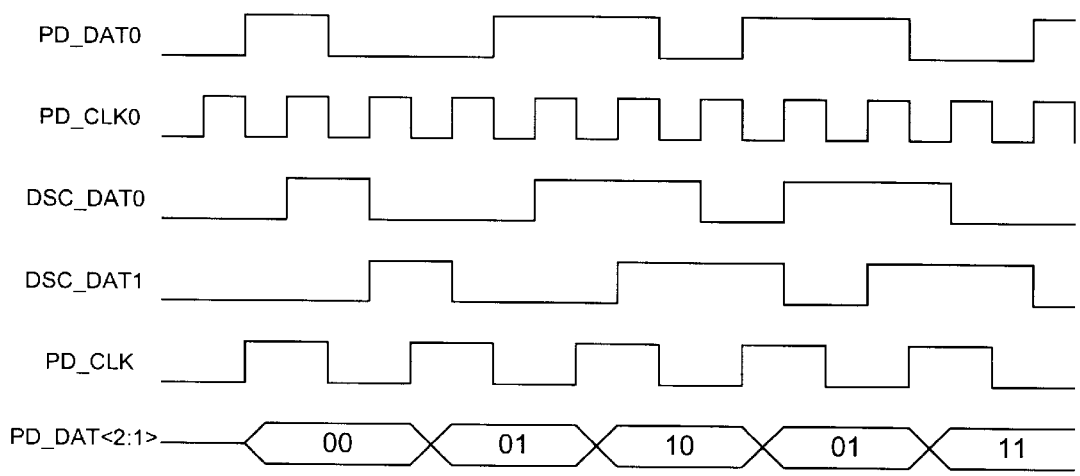
FIG. 21 is a timing diagram illustrating the various waveforms of the data stream converter circuit.

Referring to FIG. 21, a timing diagram illustrating signal PD_DAT0, the signal PD_CLK0, the signal DSC_DAT0, the signal DSC_DAT1, the signal PD_CLK, and the signal PD_DAT<2:1> of the data stream converter circuit 103.

Figure 22:
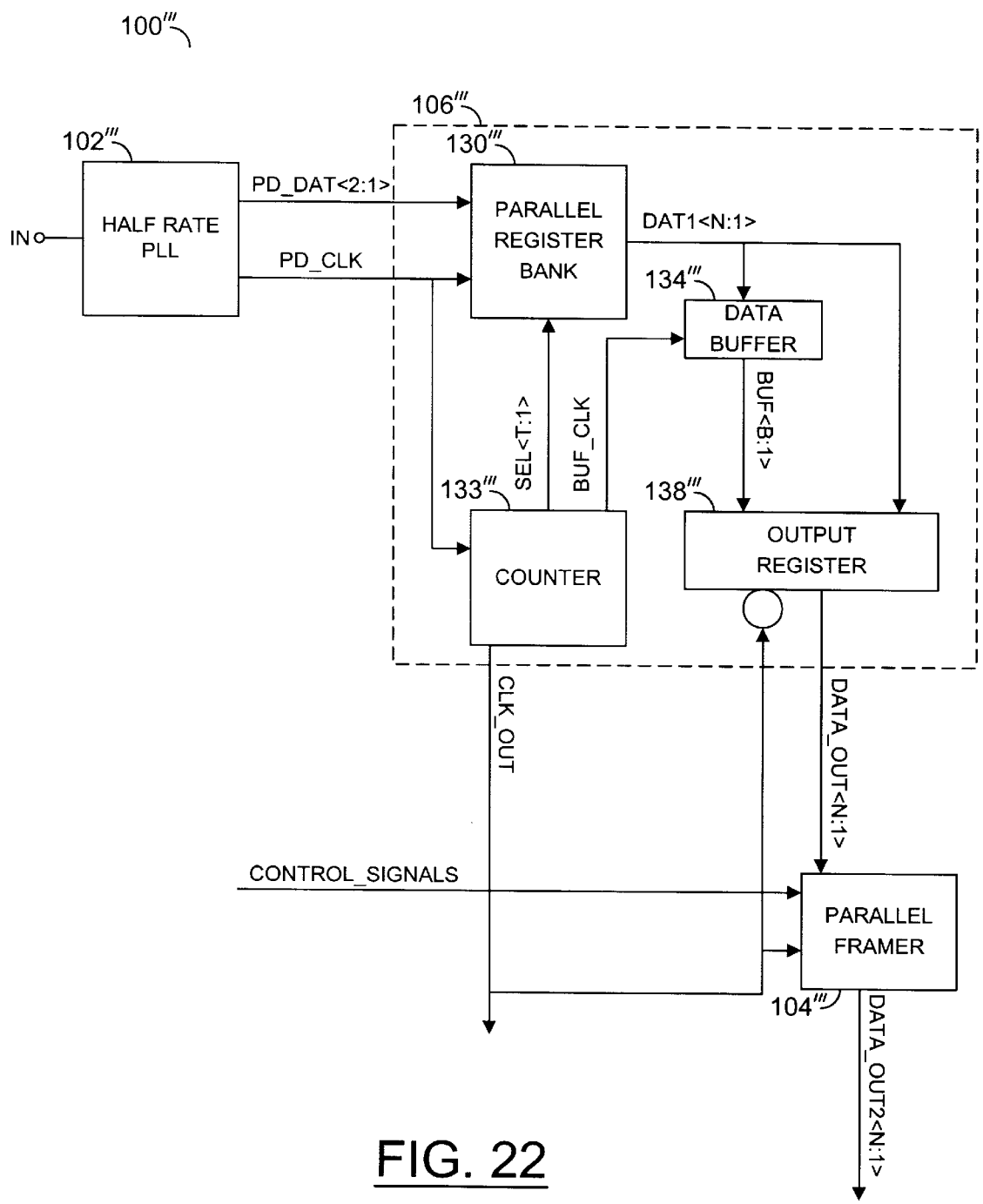
FIG. 22 is another alternate embodiment of the present invention.

Referring to FIG. 22, a circuit 100''' illustrating another alternate embodiment of the present invention is shown. The circuit 100''' generally implements a conversion (or deserializer) circuit 106''' that does not include the multiplexer 136 shown in FIGS. 4 and 5. In such an example, the circuit 100''' may be implemented as a stand alone deserializer without framing.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to present a clock signal and a data signal having a second data rate in response to an input signal having a first data rate;
   a deserializer circuit comprising a parallel register bank configured to generate an output signal in response to (i) said clock signal, (ii) said data signal and (iii) one or more select signals; and
   a buffer circuit configured to generate a buffered data signal in response to (i) a buffered clock signal and (ii) said output signal.

2. The apparatus according to claim 1, wherein said deserializer circuit further comprises a state machine configured to shift said data signal with respect to said clock signal in response to a control signal.

3. The apparatus according to claim 2, wherein said state machine is further configured to time said buffered clock signal and an output clock signal.

4. The apparatus according to claim 3, wherein said deserializer circuit further comprises a multiplexer configured to present a second output signal in response to (i) said buffered data signal, (ii) said output signal, and (iii) one or more multiplexer select signals.

5. The apparatus according to claim 4, wherein said deserializer circuit further comprises a framer circuit configured to present said control signal and said one or more multiplexer select signals in response to said output clock signal.

6. The apparatus according to claim 2, wherein said state machine is further configured to control update processes of (i) said parallel register bank, (ii) said buffer circuit, and (iii) an output register.

7. The apparatus according to claim 1, wherein said parallel register bank comprises a plurality of register elements.

8. The apparatus according to claim 7, wherein the number of said plurality of parallel register elements is N/M and said first circuit operates at a data rate equal to 1/M, where M and N are positive integers.

9. The apparatus according to claim 1, wherein said first circuit comprises a phase-locked loop.

10. The apparatus according to claim 1, wherein said first circuit operates at said first data rate.

11. The apparatus according to claim 1, wherein said second data rate is 1/M of said first data rate, where M is a positive integer.

12. The apparatus according to claim 1 comprising:

a converter circuit configured to generate a converted clock signal and a converted data signal operating at said second data rate presented to said deserializer circuit.

13. The apparatus according to claim 1, wherein said deserializer circuit further comprises an output register configured to present an adjusted output signal in response to (i) said buffered data signal and (ii) said output signal.

14. An apparatus comprising:

means for generating a clock signal and a data signal having a second data rate in response to an input signal having a first data rate;

means for generating an output in response to (i) said clock signal, (ii) said data signal and (iii) one or more select signals; and means for generating a buffered data signal in response to (i) a buffered clock signal and (ii) said output.

15. The circuit according to claim 14, further comprising:

means for generating said select signals in response to said clock signal.

16. A method for deserializing a data input signal comprising the steps of:

(A) generating a clock signal and a data signal having a second data rate in response to said data input signal having a first data rate;

(B) generating an output in response to (i) said clock signal, (ii) said data signal and (iii) one or more select signals; and (C) generating a buffered data signal in response to (i) a buffered clock signal and (ii) said output.

17. The method according to claim 16, further comprising the step of:

(D) generating said one or more select signals in response to said clock signal.

18. The method according to claim 17, wherein step (D) further comprises the substep of:

generating an output clock signal.

19. The method according to claim 18, wherein said second data rate is equal to 1/M of said first data rate, where M is a positive integer.

20. The method according to claim 17, wherein said method further comprises the step of:

(E) shifting said data signal with respect to said clock signal in response to a control signal.

* * * * *